United States Patent
Liu et al.

(10) Patent No.: US 7,578,890 B2
(45) Date of Patent: Aug. 25, 2009

(54) METHOD FOR REMOVING CONTAMINANTS FROM SILICON WAFER SURFACE

(76) Inventors: Yuling Liu, No. 8, Guangrong Dao, Hebei District, Tianjin (CN) 300130; Xinhuan Niu, No. 8, Guangrong Dao, Hebei District, Tianjin (CN) 300130; Shengli Wang, No. 8, Guangrong Dao, Hebei District, Tianjin (CN) 300130; Juan Wang, No. 8, Guangrong Dao, Hebei District, Tianjin (CN) 300130; Weiwei Li, No. 8, Guangrong Dao, Hebei District, Tianjin (CN) 300130; Zhenguo Ma, No. 8, Guangrong Dao, Hebei District, Tianjin (CN) 300130

( * ) Notice: Subject to any disclaimer, the term of this patent is extended or adjusted under 35 U.S.C. 154(b) by 0 days.

(21) Appl. No.: 11/753,219

(22) Filed: May 24, 2007

(65) Prior Publication Data
US 2007/0277847 A1  Dec. 6, 2007

(30) Foreign Application Priority Data
May 31, 2006 (CN) .................... 2006 1 0013981

(51) Int. Cl.
*B08B 3/00* (2006.01)
*B08B 3/12* (2006.01)
*C25F 1/00* (2006.01)
*C25F 3/30* (2006.01)

(52) U.S. Cl. .............. 134/26; 134/1; 134/1.3; 134/2; 134/34

(58) Field of Classification Search .......... 134/1, 134/1.3, 2, 26, 34
See application file for complete search history.

(56) References Cited

U.S. PATENT DOCUMENTS

| | | | | |
|---|---|---|---|---|
| 5,676,760 A | * | 10/1997 | Aoki et al. | 134/1.3 |
| 2002/0066717 A1 | * | 6/2002 | Verhaverbeke et al. | 216/13 |
| 2005/0224369 A1 | * | 10/2005 | Nyman et al. | 205/701 |
| 2006/0270573 A1 | * | 11/2006 | Ikemoto et al. | 510/175 |

FOREIGN PATENT DOCUMENTS

WO    WO 2005076332 A1 *  8/2005

OTHER PUBLICATIONS

Daintith, John. The Fact on File Dictionary of Chemistry. 2005. Facts on File, 4th Edition, pp. 96-97.*

* cited by examiner

*Primary Examiner*—Michael Cleveland
*Assistant Examiner*—Nicole Blan
(74) *Attorney, Agent, or Firm*—Matthias Scholl P.C.; Matthias Scholl

(57) ABSTRACT

Taught is a method of removal surface contaminants, including organic contaminants, metal ions and solid particles, from silicon wafer surface comprising the following steps: (a) submerging the silicon wafer surface in an aqueous cleaning agent solution through which current is passed using a boron-doped diamond film as an electrode; (b) submerging the silicon wafer surface in an aqueous cleaning agent solution; subjecting the silicon wafer to ultrasound waves; and, optionally, heating the solution; (c) submerging the silicon wafer surface in water through which current is passed using a boron-doped diamond film as an electrode; (d) submerging the silicon wafer surface in water with ultrasound and heating; (e) repeating step (d); and (f) spraying the silicon surface with water. The results obtained using the method according to this invention are far superior to those obtained with conventional methods. The technology is simple, convenient to operate, and environmentally friendly.

21 Claims, 5 Drawing Sheets wherein R from $C_{12}H_{25}$ to $C_{18}H_{37}$ and n=20 - "O-20"

wherein R from $C_7H_{15}$ to $C_9H_{19}$ and n = 5-6 - "JFC"

wherein R =
$C_{12}H_{25}$ - lauryl alcohol polyoxyethylene ether
$C_{18}H_{37}$ - stearyl alcohol polyoxyethylene ether
$C_8H_{17}$ - octanol polyoxyethylene ether
$C_{13}H_{27}$ - tridecyl polyoxyethylene ether alkyol amide wherein R=C$_{17}$H$_{33}$ and x+y+z+w=5 - Tween-80

METHOD FOR REMOVING CONTAMINANTS FROM SILICON WAFER SURFACE

CROSS-REFERENCE TO RELATED APPLICATIONS

Pursuant to 35 U.S.C. §119 and the Paris Convention Treaty, this application claims the benefit of Chinese Patent Application No. 200610013981.9 filed May 31, 2006, the contents of which are incorporated herein by reference.

BACKGROUND OF THE INVENTION

1. Technical Field

The invention relates generally to semiconductor cleaning, more particularly to a method of electrochemical removal of contaminants, including solid particles, organic contaminants, and metal ions, from the surface of a silicon wafer during IC chip manufacture.

2. Background of the Invention

The density of ultra large-scale integrated circuits (ULSI) is rapidly increasing and the device feature size is becoming smaller. This leads to more stringent requirements for chip surface contamination. In the process of producing ULSI, the surface cleanliness of the chip is one of the most important factors influencing the quality and reliability of the devices.

In the preparation process, the chip's surface may be exposed to various contaminants, such as oil, wax, photo resist, metal ions, and many others. These contaminants must be removed; otherwise, they will have adverse impact on the follow-up processes and could lead to catastrophic chip failure.

Chip surface contaminants may weaken the bonding between the chip surface and the deposition membrane, and thereby adversely affect IC properties. They may also be converted to other harmful products, causing additional pollution on the chip surface. For example, when a chip is heated at high temperatures in an anaerobic environment, organic contaminants are carbonized, and will react with silicon to produce silicon carbide on the chip's surface.

Conventional solutions used for removal of organic contaminations from the IC chip surface include RCA-I and RCA-III. RCA-I, also known as AMP, is a mixture of $NH_4OH$ and $H_2O_2$ in $H_2O$ at 65-80° C. It is an alkaline liquid, having oxidative and chelating properties. It can remove certain types of organics, photo resist, membrane remnants, and some heavy metal ions. On the surface of the silicon chip, RCA-I can react with silicon. This helps the organic contaminants break away from the chip surface. However, this also corrupts the silicon surface according to the following chemical equations:

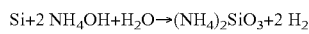

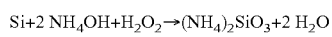

Because the reactions take place unevenly throughout the silicon surface, they are a cause of non-planarity. At high pH conditions, $H_2O_2$ facilitates the deposition of metal contaminants on silicon surface. Even when the concentration of $H_2O_2$ is too low to affect deposition, $NH_4OH$ will corrupt the silicon surface, and silicon flecks will appear. When working with $NH_4OH$ appropriate safety precautions must be taken which increases the production cost.

RCA-III, also known as SPM, is a mixture of $H_2SO_4$ and $H_2O_2$ in deionized $H_2O$ at 100-130° C. RCA-III is an oxidative acid solution. It can remove organic matter, photo resist, and other acid soluble impurities. However, because RCA-III contains $H_2SO_4$, a strong acid and an oxidant, it carbonizes organic impurities, causing the silicon surface to turn black and making the cleaning process more difficult. $H_2SO_4$ in the wastewater pollutes the environment.

The aforementioned cleaning solutions contain chemicals at a certain fixed concentration. Because the concentration of contaminant on the silicon surface varies, the chemical reactions between the cleaning chemicals and the contaminants are not optimized and may not even occur at too low concentrations. In addition, if cleaning solutions are reused, their cleaning power will decrease over time as the cleaning chemicals are consumed. To maintain a lasting cleaning effect, frequent replacement of cleaning agents is needed. This often generates a large amount of wastewater and leads to environmental pollution.

Another reagent used for removing organic contaminants from chip surfaces is aqueous $O_3$. $O_3$ is a powerful water-soluble oxidant. However, the solubility of $O_3$ in water is not easily controlled. In addition, stringent safety precaution must be taken when working with $O_3$ because it is hazardous to human health.

Solid particles and metal ions have a great impact on the quality and reliability of IC chips. Metal ion adsorption on the substrate surface may disrupt silicon doping of the underlying structures resulting in reduced lifetime, channel breakdown and interface defects. Solid particles adsorbed on the surface will cause about pinholes and tiny cracks resulting in short circuit or open circuit of adjacent wires.

In order to meet the requirements for further development of microelectronics, a method for removal of contaminants should remove not only organic contaminants but also solid particles, metal ions, etc. However, conventional methods of chip surface cleaning remove organic contaminants only. Accordingly, much opportunity remains for improvement in this area of technology.

BRIEF SUMMARY OF THE INVENTION

This invention can make up the shortcomings of existing technologies. In one aspect of the invention, electrolysis using a diamond electrode and a cleaning agent are utilized in combination and in succession to remove organic residues, as well as solid particles and metal ions from silicon surface. The technology has a good cleaning effect, uses a simple technique, is easy to operate, and meets environmental requirements.

A diamond electrode, a diamond film electrode, a diamond membrane electrode, or a boron-doped diamond film (BDD) electrode is essential to the invention. A diamond electrode is used as the anode, and graphite is used as the cathode to pass current through an electrolyte in which silicon wafer surfaces are submerged. At the diamond electrode oxidation and decomposition of organic contaminants takes place. The cleaning agent is utilized to remove the oxidized organic residues from the chip surface. HO. and O. radicals are produced at the anode, and combine to form $H_2O_2$, $O_3$ and $O_2$. The concentration of these oxidants can be controlled by regulating the electric current.

The method of removal of surface contaminants from silicon wafer surface comprises the following steps:

(1) Submerging the silicon wafer surface in an aqueous cleaning agent solution through which current is passed using a boron-doped diamond film as an electrode. A first tank comprises a cleaning agent dissolved in water. The water volume is 8-15 times that of the cleaning agent. The chip loader with the chips is soaked in the cleaning solution in the first tank. Two electrodes, an anode and a cathode are disposed in the first tank and are submerged in the cleaning solution. The anode is made of a boron-doped diamond film; the cathode is made of graphite. The electrolyte is a cleaning agent solution. The voltage between the two electrodes is controlled at about 15 V, with the current ranges from 30 A to 60 A. Under these conditions, the chips are cleaned for 5-10 minutes at room temperature. Optionally, ultrasound waves can be directed at the silicon surfaces during this step. The cleaning agent comprises one or more various surfactants and one or more bases. The total concentration of the surfactants ranges from 2% by volume to 15% by volume; the base concentration ranges from 40% by volume to 45% by volume, and the rest is deionized water. In this step, at the diamond electrode HO., O., $H_2O_2$, $O_3$, $O_2$, etc., are produced. These oxidants degrade and help to remove the organic contaminants from the chip surface as the oxidation products are water-soluble.

(2) Submerging the silicon wafer surface in an aqueous cleaning agent solution, heating, and subjecting the silicon wafer to ultrasound waves. A second tank comprises a cleaning agent and water. The water volume is 8-15 times that of the cleaning agent, and the solution is heated to 50-60° C. The chip loader with the chips is taken out from the first tank and placed into the second tank, and then, cleaned with the help of ultrasonic waves for 5-10 minutes. The cleaning agent comprises one or more various surfactants and bases. The total concentration of the surfactants ranges from 2% by volume to 15% by volume; the base concentration ranges from 40% by volume to 45% by volume, and the rest is water. In this step, cleaning agent is used to reduce the surface tension, enhance the transfer of substances, and dissolve and decompose the contaminants. The contaminants adsorbed on the chip surface are further removed.

(3) Submerging the silicon wafer surface in electrolyte through which current is passed using a boron-doped diamond film as an electrode. A third tank comprises an electrolyte solution heated to 50-60° C. The electrolyte solution comprises NaOH, KOH, NaCO3, KCO3, organic amines, tetramethyl ammonium hydroxide, and/or other compounds suitable for use in electrolysis dissolved in deionized water at concentrations sufficient to achieve currents similar to those in step 1 under similar potentials. Two electrodes, an anode and a cathode are disposed in the third tank and are submerged in water. The anode is made of boron-doped diamond film; the cathode is made of graphite. A potential of 30 V is applied between the electrodes. The chip loader with the chips is taken out from the second tank and placed into the third tank. Under these conditions, the chips are cleaned for 5-10 minutes at room temperature. In this step, the oxidants, produced by diamond electrode, will oxidize and help remove any remaining contaminants and traces of cleaning agent remaining on the surface from step 2.

(4) Submerging the silicon wafer surface in water with ultrasound and heating. A fourth tank contains deionized water heated to 50-60° C. The chip loader with the chips is taken out of the third tank and placed into the fourth tank. Ultrasound waves are directed onto the silicon surface. Under these conditions, the chips are cleaned for 5-10 minutes at room temperature. In this step, water rinses off any remaining traces of contaminants and the cleaning agent.

(5) Submerging the silicon wafer surface in water with ultrasound and heating. A fifth tank contains deionized water heated to 50-60° C. The chip loader with the chips is taken out of the fourth tank and placed into the fifth tank. Ultrasound waves are directed onto the silicon surface. Under these conditions, the chips are cleaned for 5-10 minutes at room temperature. In this step, water rinses off any remaining traces of contaminants and the cleaning agent.

(6) Spraying silicon surface with water. The chip loader with the chips is taken out of the fifth tank. The silicon surface is sprayed with water at a temperature of 50-60° C. for 2-5 minutes. In this step, water rinses off any remaining traces of contaminants and the cleaning agent.

(7) Drying. Hot air, infrared radiation, or another form of heat is directed at the silicon surface for 3-5 minutes. During this step, water is removed from the surface.

The surfactants employed in methods of this invention are selected from a group comprising non-ionic surfactants, such as polyoxyethylene, polyol ester, and polymer surfactants.

The base is selected from a group consisting of organic and inorganic bases, including but not limited to potassium hydroxide, sodium hydroxide, ammonia, sodium carbonate, sodium acetate and quaternary ammonium salts.

To achieve an optimum cleansing effect, the cleaning agent is comprised of the following chemical agents by volume: 40-45% organic base(s), 1.5-2% polyethylene glycol non-ionic surfactant, 5-10% polyoxyethylene-ether penetrant, with the remaining portion being deionized water.

By adjusting the pH of the cleaning agent solution, the organic base(s) are electrolyzed at a speed desired to facilitate a constant rate of contaminant decomposition. The organic base(s) possess chelating properties, and can thereby remove solid particles and metal ions.

The polyoxyethylene-ether penetrant is, without limitation, a fatty alcohol polyoxyethylene ether, or an alkylphenol ethoxylate. The penetrants reduce the surface tension so that the cleaning agent acts on the entire surface and within any cracks of the surface. The hydrophilic and hydrophobic bases of the penetrants coordinate with each other, loosen the contaminants adsorbed on the surface and in the crevices, and form a protective layer on the surface to prevent re-adsorption of contaminants.

Other penetrants used in the methods of the invention include tall oil diethanolamine which is the reaction product of tall oil and diethanolamine. Tall oil is a by-product reclaimed from the waste water of pine paper pulp. It consists of rosin acid (50%-60%) and fatty acids (30%-40%).

The penetrants exhibit not only strong penetration, but also reduce the surface tension of the solution. They carry the cleaning agent between the chip surface and the contaminants to achieve the purpose of removing contaminants.

Water used in methods of the invention is selected from deionized water (DI-water) and distilled water; particularly DI-water of 10-15 megaohm (MΩ) or DI-water of 15-18 megaohm (MΩ). The voltage between the electrodes is controlled at about 15 V, with the current ranging from 30 A to 60 A.

The cleaning is not dependent on ultrasonic equipment, and may not need additional heating.

The methods of the invention are applicable to the cleaning of virgin wafer (pre-treatment) when aqueous solutions of inorganic alkali or inorganic salts, such as NaOH, KOH, NaCO3 or KCO3 are selected as electrolyte in step 3. The methods of the invention are also applicable to the cleaning of wafer after lithography and etching (post-treatment) when organic amines or tetramethyl ammonium hydroxide solution is selected as electrolyte in step 3.

The invented method has the following characteristics:

1. Electrolysis replaces traditional oxidants in a cleaning agent. The concentration of the oxidants, which are produced at the diamond electrode, are controlled through regulation of the voltage and electric current. The concentration of the oxidants can be kept stable. The cleaning agent can be recycled, reducing the production costs.

2. The organic base is electrolyzed slowly. It can continuously supply the hydroxide ions consumed from the solution; thus, the contaminants are oxidized evenly. The solution, incl. the organic base, can also decrease the surface tension. According to the principle that like dissolves like, the organic base(s) can dissolve certain organic contaminants. The organic base is also a chelating agent, and this helps to remove the solid particles and metal ions. This is one of the reasons for why the methods of the invention are superior to other conventional methods.

3. The chemicals selected as cleaning agents are comparatively friendly to the environment.

4. The chosen penetrant can reduce the silicon surface tension, and increase the permeability of the cleaning agent; thus improving the cleaning effect.

5. The surfactants and penetrants can also reduce the surface tension. They have good water solubility and permeability and are relatively harmless to the environment. They can also enhance the transfer of substances, and insure that the consistency of cleaning is as desired, without increasing surface non-planarity.

6. The method is simple and convenient to operate; it can improve the production efficiency.

BRIEF DESCRIPTION OF THE DRAWINGS

Below, the invention is explained in more detail with reference to accompanying drawings, in which.

DETAILED DESCRIPTION OF THE INVENTION

Figure 1:
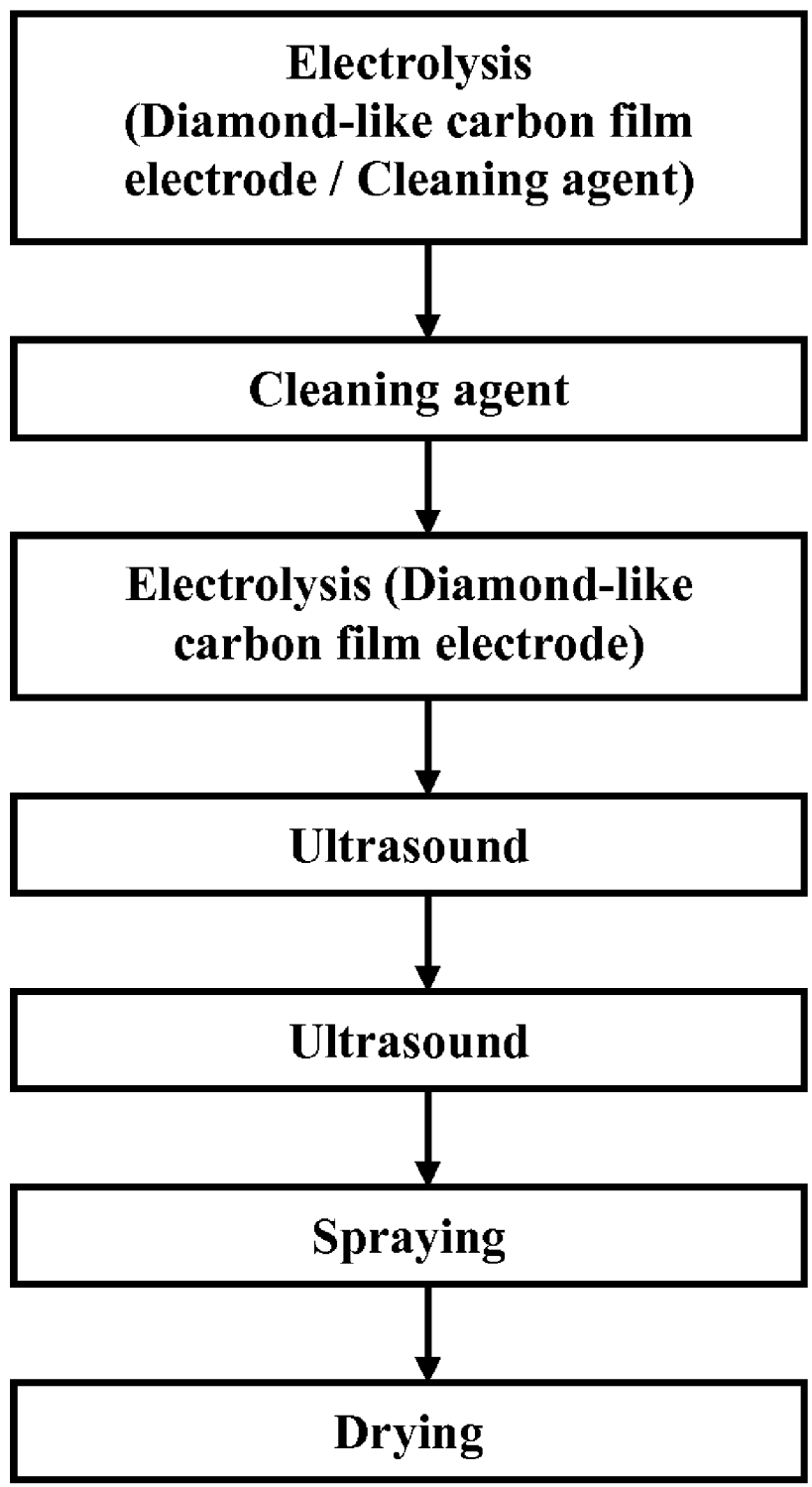
FIG. 1 shows a process flow chart of the method for removing contaminants from silicon wafer surface according to one embodiment of the invention.

The invention will now be described in more detail with respect to the following, specific, non-limiting examples.

EXAMPLES

Example 1

The composition of the cleaning agent expressed as volume percentages was as follows: 40% triethanolamine (organic base), 1.5% O-20, (surfactant, $C_{12-18}H_{25-37}$—O—$(CH_2CH_2O)_{20}$—H), 5% JFC (penetrant, $C_{7-9}H_{15-19}$—O—$(CH_2CH_2O)_{5-6}$—H), and 53.5% DI-water (18 MΩ). The components were well mixed with each other, and in this way the cleaning agent solution was obtained.

A diamond electrode was used in conjunction with the cleaning agent. A first tank was filled with cleaning agent and diluted with DI-water. The DI-water volume was 8 times that of the cleaning agent. The chip loader with the chips was placed into the first tank. Two electrodes were disposed in the tank, a boron-doped diamond film anode and a graphite cathode. The solution of the cleaning agent was the electrolyte. A voltage difference between the electrodes of about 15 V was applied, and current was about 30 A. The chips remained under these conditions for 5 minutes at room temperature. Optionally, ultrasound waves were directed onto the silicon surface.

Ultrasound waves were produced by Kunshan Ultrasound Generator Model KQ500DE manufactured by Kunshan Ultrasound Equipment Company (China). The ultrasound frequency used was 40 kHz. The power setting was from 40-100% of the maximum 500 W.

A second tank was filled with the cleaning agent as above and DI-water. The DI-water volume was 8 times that of the cleaning agent. The solution was heated to 50° C. The chip loader with the chips was taken out of the first tank and placed into the second tank. Ultrasound waves were directed onto the silicon surface. The chips remained under these conditions for 5 minutes.

A third tank was filled with an electrolyte solution comprising 0.1 M solution of $Na_2SO_4$ in deionized water. Two electrodes were disposed in the tank: a boron-doped diamond film anode and a graphite cathode. The chip loader with the chips was taken out of the second tank and placed into the third tank. Ultrasound waves were directed onto the silicon surface. A voltage difference between the electrodes of about 15 V was applied, and current was about 30 A. The chips remained under these conditions for 5 minutes at room temperature.

A fourth tank was filed with DI-water at 60° C. The chip loader with the chips was taken out of the third tank and placed into the fourth tank. Ultrasound waves were directed onto the silicon surface. The chips remained under these conditions for 5 minutes.

A fifth tank was filed with DI-water at 60° C. The chip loader with the chips was taken out of the fourth tank and placed into the fifth tank. Ultrasound waves were directed onto the silicon surface. The chips remained under these conditions for 5 minutes.

The IC chips were taken out of the fifth tank and were sprayed with DI-water at 60° C. for 2 minutes.

The IC chips were then hot air dried for 3 minutes.

Figure 2:
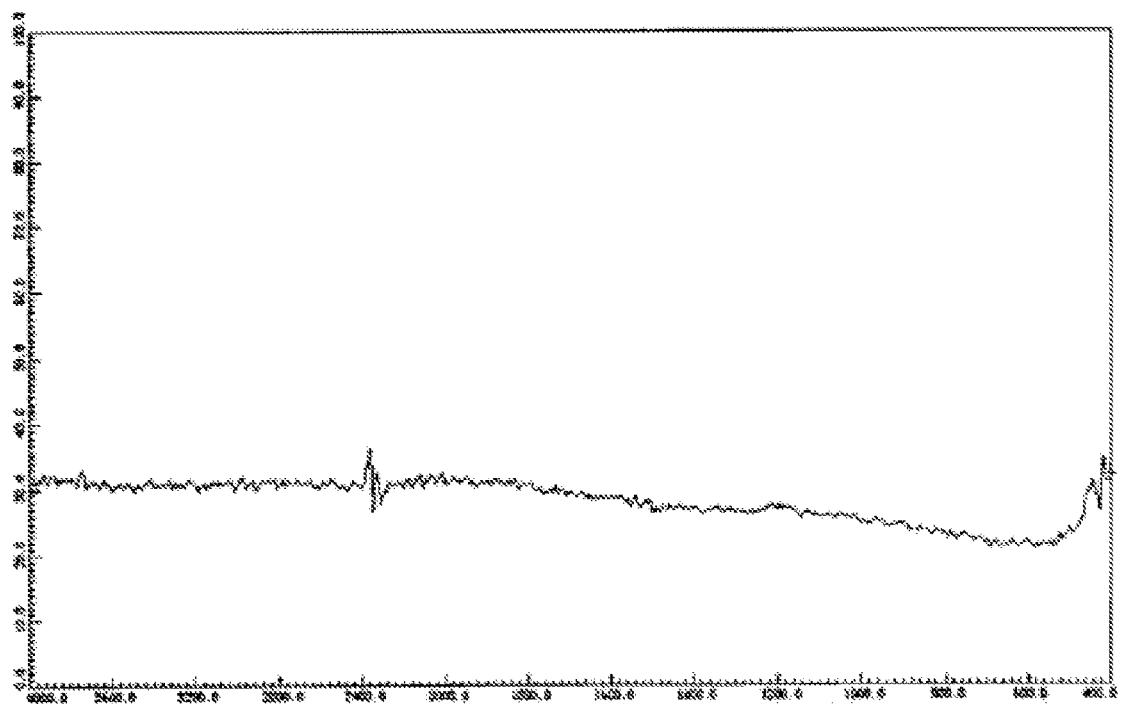
FIG. 2 shows an FT-IR spectrum of a silicon wafer after being cleaned by the method according to the invention.
Figure 3:
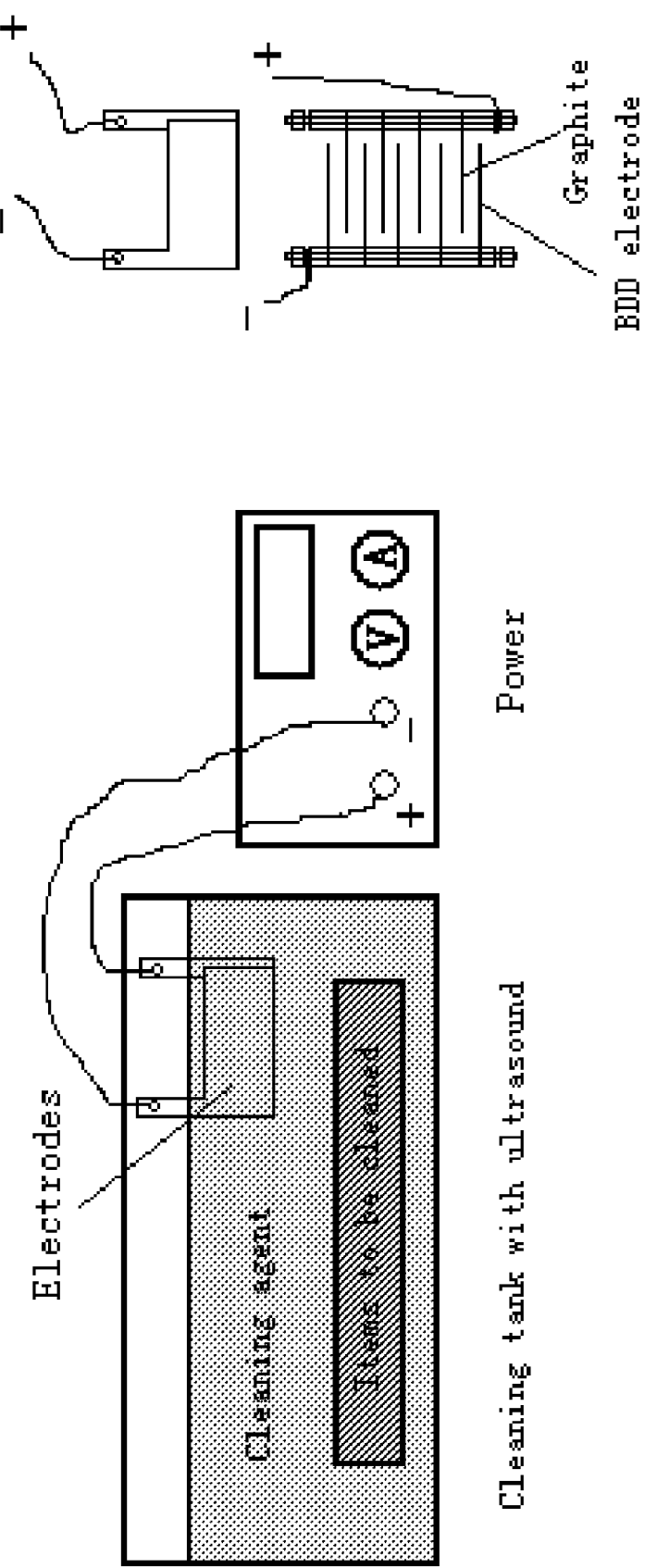
FIG. 3 illustrates a setup for electrolysis showing an arrangement of BDD and graphite electrodes used in certain embodiments of the invention.
Figure 4:
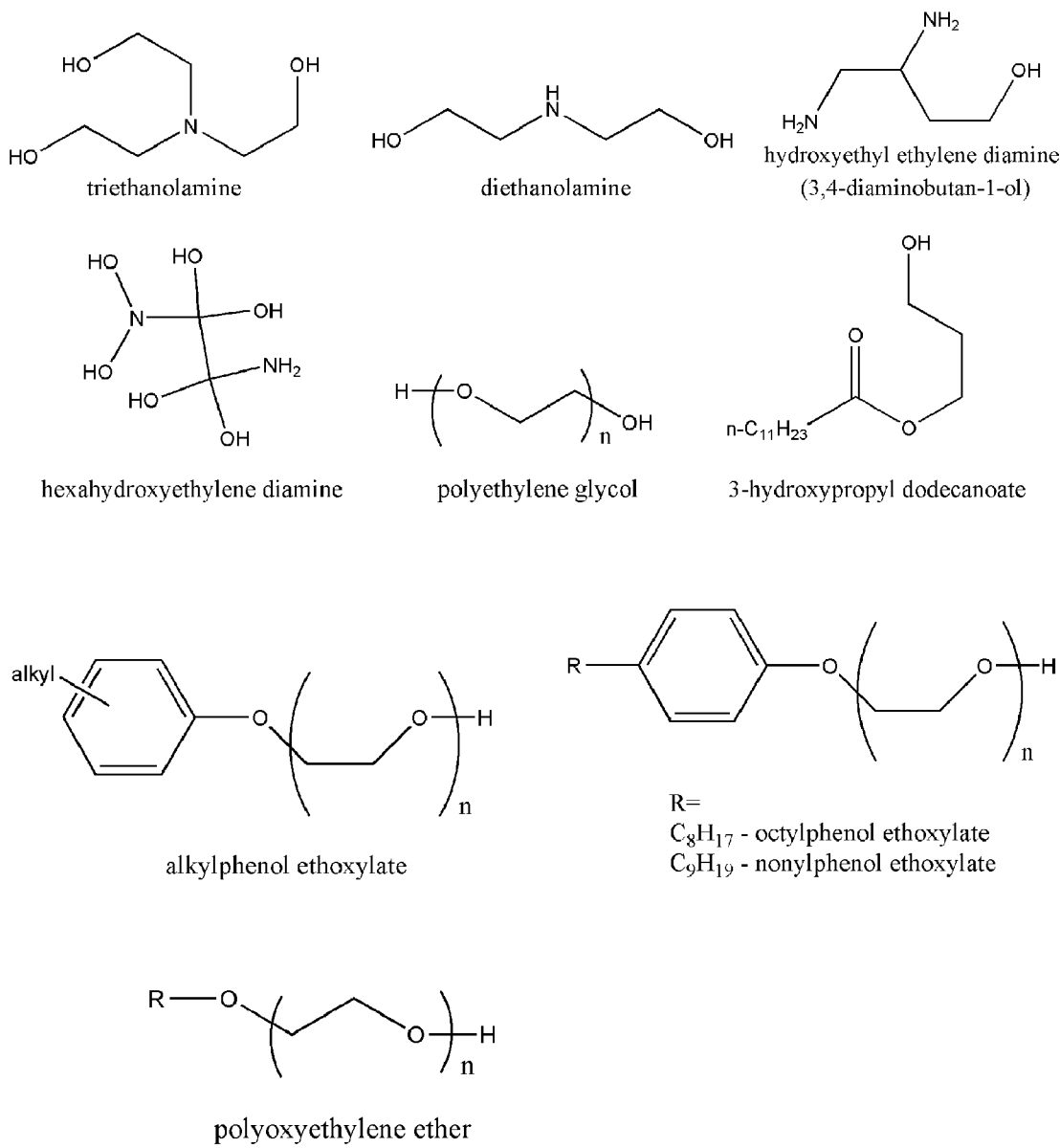
FIG. 4-5 illustrate chemical compounds used in the embodiments of the invention.
Figure 4:
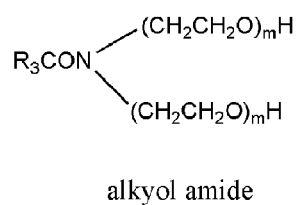
Figure 5:
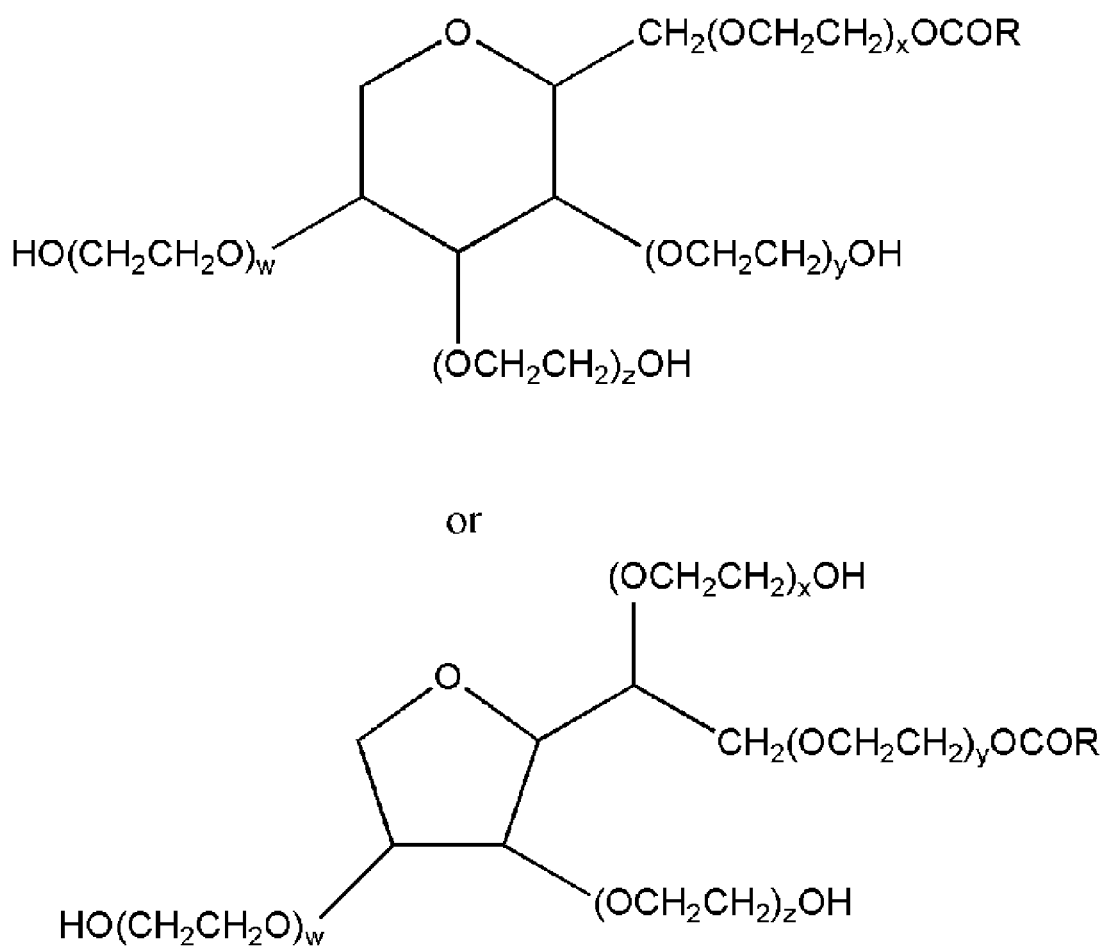

As a result of performing the cleaning steps in this example, the metal ion concentration on the chips was reduced to the ppb level. On the 8-inch chip surface, there were less than 10 particles whose diameter was bigger than 0.2 μm. An FT-IR analysis confirmed that the percentage of chips fulfilling these criteria was above 99%. FIG. 2 shows the cleaning effect as tested by an FT-IR spectrophotometer. The FT-IR spectrum was taken of a silicon surface after being cleaned according by method described in this example. The spectral line was smooth, and there weren't any IR-detectable amounts of organic contaminants on the chip surface.

Example 2

The composition of the cleaning agent expressed as volume percentages was as follows: 40% diethanolamine (organic base), 1.5% lauryl alcohol (surfactant), 5% palmityl alcohol; and 53.5% DI-water (18 MΩ). The components were well mixed with each other, and in this way the cleaning agent solution was obtained.

In other aspects, steps and conditions described in Example 1 were followed, except that the voltage applied between the electrodes of 15 V produced a current of about 60 A.

Using the cleaning method of this example, metal ion concentration on chips was reduced to the ppb level. On the 8 inch chip surface, there were less than 15 particles whose diameter was bigger than 0.2 μm. An FT-IR analysis confirmed that the percentage of chips fulfilling these criteria was above 98%.

Example 3

The composition of the cleaning agent expressed as volume percentages was as follows: 45% ammonium hydroxide ($NH_4OH$ aq., inorganic base), 2% Tween-80 (surfactant), 10% octanol polyoxyethylene ether (penetrant), and 43% for DI-water (15 M$\Omega$). The components were well mixed with each other, and in this way the cleaning agent solution was obtained.

A diamond electrode was used in conjunction with the cleaning agent. A first tank was filled with cleaning agent and diluted with DI-water. The DI-water volume was 15 times that of the cleaning agent. The chip loader with the chips was placed into the first tank. Two electrodes were disposed in the tank, a boron-doped diamond film anode and a graphite cathode. The solution of the cleaning agent was the electrolyte. A voltage difference between the electrodes of about 15 V was applied, and current was about 35 A. The chips remained under these conditions for 10 minutes at room temperature. Optionally, ultrasound waves were directed onto the silicon surface.

A second tank was filled with the cleaning agent as above and DI-water. The DI-water volume was 15 times that of the cleaning agent. The solution was heated to 50° C. The chip loader with the chips was taken out of the first tank and placed into the second tank. Ultrasound waves were directed onto the silicon surface. The chips remained under these conditions for 10 minutes.

A third tank was filled with an electrolyte solution comprising 0.2 M solution of $Na_2SO_4$ in deionized water. Two electrodes were disposed in the tank: a boron-doped diamond film anode and a graphite cathode. The chip loader with the chips was taken out of the second tank and placed into the third tank. Ultrasound waves were directed onto the silicon surface. A voltage difference between the electrodes of about 15 V was applied, and current was about 35 A. The chips remained under these conditions for 10 minutes at room temperature.

A fourth tank was filed with DI-water at 50° C. The chip loader with the chips was taken out of the third tank and placed into the fourth tank. Ultrasound waves were directed onto the silicon surface. The chips remained under these conditions for 10 minutes.

A fifth tank was filed with DI-water at 50° C. The chip loader with the chips was taken out of the fourth tank and placed into the fifth tank. Ultrasound waves were directed onto the silicon surface. The chips remained under these conditions for 10 minutes.

The IC chips were taken out of the fifth tank and were sprayed with DI-water at 50° C. for 5 minutes.

The IC chips were dried by directing infrared radiation onto the chips for 5 minutes. The infrared radiation source was provided by Phillips.

As a result of performing the cleaning steps in this example, the metal ion concentration on the chips was reduced to the ppb level. On the 8-inch chip surface, there were less than 10 particles whose diameter was bigger than 0.2 µm. An FT-IR analysis confirmed that the percentage of chips fulfilling these criteria was above 98%.

Example 4

The composition of the cleaning agent expressed as volume percentages was as follows: 45% tetramethyl ammonium hydroxide ($NMe_4OH$, organic base), 2% octylphenol ethoxylate (surfactant, $C_8H_{17}$—$C_6H_4$—O—$(CH_2CH_2O)_nH$, n=18-20), 10% octanol polyoxyethylene ether (penetrant, $C_8H_{17}$—O—$(CH_2CH_2O)_nH$, n=4-6), and 43% DI-water (15 M$\Omega$). The components were well mixed with each other, and in this way the cleaning agent solution was obtained.

In other aspects, steps and conditions described in Example 3 were followed, except that the voltage applied between the electrodes of 10 V produced a current of about 35 A.

Using the cleaning method of this example, metal ion concentration on chips was reduced to the ppb level. On the 8 inch chip surface, there were less than 15 particles whose diameter was bigger than 0.2 µm. An FT-IR analysis confirmed that the percentage of chips fulfilling these criteria was above 98%.

Example 5

The composition of the cleaning agent expressed as volume percentages was as follows: 42% hexahydroxy ethylene diamine (organic base), 1.8% nonylphenol ethoxylate (surfactant), 7% sorbitan monooleate (penetrant), and 49.2% DI-water (10 M$\Omega$). The components were well mixed with each other, and in this way the cleaning agent solution was obtained.

A diamond electrode was used in conjunction with the cleaning agent. A first tank was filled with cleaning agent and diluted with DI-water. The DI-water volume was 10 times that of the cleaning agent. The chip loader with the chips was placed into the first tank. Two electrodes were disposed in the tank, a boron-doped diamond film anode and a graphite cathode. The solution of the cleaning agent was the electrolyte. A voltage difference between the electrodes of about 15 V was applied, and current was about 40 A. The chips remained under these conditions for 6 minutes at room temperature. Optionally, ultrasound waves were directed onto the silicon surface.

A second tank was filled with the cleaning agent as above and DI-water. The DI-water volume was 10 times that of the cleaning agent. The solution was heated to 55° C. The chip loader with the chips was taken out of the first tank and placed into the second tank. Ultrasound waves were directed onto the silicon surface. The chips remained under these conditions for 10 minutes.

A third tank was filled with an electrolyte solution comprising 0.3 M solution of $Na_2SO_4$ in deionized water. Two electrodes were disposed in the tank: a boron-doped diamond film anode and a graphite cathode. The chip loader with the chips was taken out of the second tank and placed into the third tank. Ultrasound waves were directed onto the silicon surface. A voltage difference between the electrodes of about 15 V was applied, and current was about 40 A. The chips remained under these conditions for 6 minutes at room temperature.

A fourth tank was filed with DI-water at 55° C. The chip loader with the chips was taken out of the third tank and placed into the fourth tank. Ultrasound waves were directed onto the silicon surface. The chips remained under these conditions for 7 minutes.

A fifth tank was filed with DI-water at 55° C. The chip loader with the chips was taken out of the fourth tank and placed into the fifth tank. Ultrasound waves were directed onto the silicon surface. The chips remained under these conditions for 7 minutes.

The IC chips were taken out of the fifth tank and were sprayed with DI-water at 55° C. for 4 minutes.

The IC chips were hot air dried for 4 minutes.

As a result of performing the cleaning steps in this example, the metal ion concentration on the chips was

Example 6

The composition of the cleaning agent expressed as volume percentages was as follows: 42% hexahydroxy ethylene diamine (organic base), 1.8% nonylphenol ethoxylate (surfactant), 7% JFC (penetrant, $C_{7\text{-}9}H_{15\text{-}19}$—O—$(CH_2CH_2O)_{5\text{-}6}$—H); and 49.2% DI-water (10 MΩ). The components were well mixed with each other, and in this way the cleaning agent solution was obtained.

In other aspects, steps and conditions described in Example 5 were followed, except that the voltage applied between the electrodes of 10 V produced a current of about 40 A.

Using the cleaning method of this example, metal ion concentration on chips was reduced to the ppb level. On the 8 inch chip surface, there were less than 15 particles whose diameter was bigger than 0.2 µm. An FT-IR analysis confirmed that the percentage of chips fulfilling these criteria was above 98%.

Example 7

The composition of the cleaning agent expressed as volume percentages was as follows: 43% hydroxyethyl ethylene diamine (organic base), 1.6% polyethylene glycol (surfactant, HO—$(CH_2CH_2O)_n$H, n=400), 9% tall oil-diethanolamine (penetrant), and 46.4% distilled water. The components were well mixed with each other, and in this way the cleaning agent solution was obtained.

A diamond electrode was used in conjunction with the cleaning agent. A first tank was filled with cleaning agent and diluted with distilled water. The distilled water volume was 12 times that of the cleaning agent. The chip loader with the chips was placed into the first tank. Two electrodes were disposed in the tank, a boron-doped diamond film anode and a graphite cathode. The solution of the cleaning agent was the electrolyte. A voltage difference between the electrodes of about 15 V was applied, and current was about 45 A. The chips remained under these conditions for 8 minutes at room temperature. Optionally, ultrasound waves were directed onto the silicon surface.

A second tank was filled with the cleaning agent as above and distilled water. The distilled water volume was 12 times that of the cleaning agent. The solution was heated to 55° C. The chip loader with the chips was taken out of the first tank and placed into the second tank. Ultrasound waves were directed onto the silicon surface. The chips remained under these conditions for 6 minutes.

A third tank was filled with an electrolyte solution comprising 0.4 M solution of $Na_2SO_4$ in deionized water. Two electrodes were disposed in the tank: a boron-doped diamond film anode and a graphite cathode. The chip loader with the chips was taken out of the second tank and placed into the third tank. Ultrasound waves were directed onto the silicon surface. A voltage difference between the electrodes of about 15 V was applied, and current was about 45 A. The chips remained under these conditions for 8 minutes at room temperature.

A fourth tank was filed with distilled water at 52° C. The chip loader with the chips was taken out of the third tank and placed into the fourth tank. Ultrasound waves were directed onto the silicon surface. The chips remained under these conditions for 8 minutes.

A fifth tank was filed with distilled water at 60° C. The chip loader with the chips was taken out of the fourth tank and placed into the fifth tank. Ultrasound waves were directed onto the silicon surface. The chips remained under these conditions for 8 minutes.

The IC chips were taken out of the fifth tank and were sprayed with distilled water at 57° C. for 4 minutes.

The IC chips were hot air dried for 5 minutes.

As a result of performing the cleaning steps in this example, the metal ion concentration on the chips was reduced to the ppb level. On the 8-inch chip surface, there were less than 15 particles whose diameter was bigger than 0.2 µm. An FT-IR analysis confirmed that the percentage of chips fulfilling these criteria was above 98%.

Example 8

The composition of the cleaning agent expressed as volume percentages was as follows: 43% hydroxyethyl ethylene diamine (organic base), 1.6% polyethylene glycol (surfactant, HO—$(CH_2CH_2O)_n$H, n=400), 9% alkylolamide (penetrant, $R_3$—CO—$N((C_2H_4O)_mH)_2$, m=1, $R_3$=$C_{11}H_{23}$); and 46.4% distilled water. The components were well mixed with each other, and in this way the cleaning agent solution was obtained.

In other aspects, steps and conditions described in Example 7 were followed, except that the voltage applied between the electrodes of 10 V produced a current of about 50 A.

Using the cleaning method of this example, metal ion concentration on chips was reduced to the ppb level. On the 8 inch chip surface, there were less than 15 particles whose diameter was bigger than 0.2 µm. An FT-IR analysis confirmed that the percentage of chips fulfilling these criteria was above 98%.

Example 9

The composition of the cleaning agent expressed as volume percentages was as follows: 43% potassium hydroxide (inorganic base), 2% 3-hydroxypropyl dodecanoate (surfactant), and 55% DI-water (8 MΩ). The components were well mixed with each other, and in this way the cleaning agent solution was obtained.

In other aspects, steps and conditions described in Example 7 were followed, except that the voltage applied between the electrodes of 10 V produced a current of about 50 A.

Using the cleaning method of this example, metal ion concentration on chips was reduced to the ppb level. On the 8 inch chip surface, there were less than 15 particles whose diameter was bigger than 0.2 µm. An FT-IR analysis confirmed that the percentage of chips fulfilling these criteria was above 98%.

Example 10

The composition of the cleaning agent expressed as volume percentages was as follows: 40% ammonium hydroxide (inorganic base), 5% tridecyl polyoxyethylene ether (surfactant, $C_{13}H_{27}$—O—$(CH_2CH_2O)_n$H, n=5, 7), 10% octylphenol ethoxylate (surfactant, $C_8H_{17}$—$C_6H_4$—O—$(CH_2CH_2O)_n$H, n=18-20), and 45% DI-water (15 MΩ). The components were well mixed with each other, and in this way the cleaning agent solution was obtained.

In other aspects, steps and conditions described in Example 7 were followed, except that the voltage applied between the electrodes of 10 V produced a current of about 50 A.

Using the cleaning method of this example, metal ion concentration on chips was reduced to the ppb level. On the 8 inch chip surface, there were less than 15 particles whose diameter was bigger than 0.2 μm. An FT-IR analysis confirmed that the percentage of chips fulfilling these criteria was above 98%.

Example 11

The composition of the cleaning agent expressed as volume percentages was as follows: 45% sodium carbonate (inorganic base), 5% stearic polyoxyethylene ether (surfactant, $C_{18}H_{37}$—O—$(CH_2CH_2O)_nH$, n=2), 5% octylphenol ethoxylate (surfactant, $C_8H_{17}$—$C_6H_4$—O—$(CH_2CH_2O)_nH$, n=18-20), and 45% DI-water (18 MΩ). The components were well mixed with each other, and in this way the cleaning agent solution was obtained.

In other aspects, steps and conditions described in Example 7 were followed, except that the voltage applied between the electrodes of 10 V produced a current of about 50 A.

Using the cleaning method of this example, metal ion concentration on chips was reduced to the ppb level. On the 8 inch chip surface, there were less than 15 particles whose diameter was bigger than 0.2 μm. An FT-IR analysis confirmed that the percentage of chips fulfilling these criteria was above 98%.

Example 12

Boron-doped diamond (BDD) films were synthesized by the hot filament chemical vapor deposition technique (HF CVD) on Si/W/Mo/Ti/Ta (15 cm×15 cm) substrate, etc. The dopant source was solid $B_2O_3$ on a pallet in the reaction chamber. The reactive gas was methane ($CH_4$) in excess hydrogen gas ($H_2$). The gas mixture was supplied to the reaction chamber at a pressure sufficient to carry out the reaction at 6.6 kPa. The distance between the filament and the substrate is about 4 mm. The temperature of the substrate was about 800° C. The resulting diamond film thickness was about 1 μm.

This invention is not to be limited to the specific embodiments disclosed herein and modifications for various applications and other embodiments are intended to be included within the scope of the appended claims. While this invention has been described in connection with particular examples thereof, the true scope of the invention should not be so limited since other modifications will become apparent to the skilled practitioner upon a study of the drawings, specification, and following claims.

All publications and patent applications mentioned in this specification are indicative of the level of skill of those skilled in the art to which this invention pertains. All publications and patent applications mentioned in this specification are herein incorporated by reference to the same extent as if each individual publication or patent application mentioned in this specification was specifically and individually indicated to be incorporated by reference.

What is claimed is:

1. A method of removal surface contaminants from silicon wafer surface comprising the following steps:
    (a) submerging the silicon wafer surface in an aqueous cleaning agent solution through which current is passed using a boron-doped diamond film as an electrode; then, removing the silicon wafer surface from the aqueous cleaning agent solution;
    (b) then, submerging the silicon wafer surface in the aqueous cleaning agent solution; subjecting the silicon wafer to ultrasound waves; and, optionally, heating the solution; then, removing the silicon wafer surface from the aqueous cleaning agent solution;
    (c) then, submerging the silicon wafer surface in an electrolyte solution through which current is passed using a boron-doped diamond film as an electrode; then, removing the silicon wafer surface from the electrolyte solution;
    (d) then, submerging the silicon wafer surface in water with ultrasound and heating; then, removing the silicon wafer surface from the water;
    (e) then, repeating step (d); and
    (f) then, spraying the silicon surface with water.

2. The method of claim 1, wherein said aqueous cleaning agent solution comprises a cleaning agent and water at a volume ration ranging from 8 to 15 parts of water for every part of the cleaning agent.

3. The method of claim 2, wherein said cleaning agent comprises one or more surfactants; one or more bases; and water.

4. The method of claim 3, wherein said cleaning agent comprises from 2% to 15% said surfactants by volume, 40% to 45% said bases by volume, and the rest is water.

5. The method of claim 3, wherein said surfactant is a non-ionic surfactant.

6. The method of claim 5, wherein said non-ionic surfactant is a polyoxyethylene surfactant, a polyol esters surfactant, or a polymer surfactant.

7. The method of claim 3, wherein said base is an organic base or an inorganic base.

8. The method of claim 3, wherein said base is an amine or a hydroxyalkyl amine.

9. The method of claim 3, wherein said cleaning agent comprises from 1.5 to 2% polyethylene glycol non-ionic surfactant by volume, and from 5 to 10% polyoxyethylene-ether penetrant by volume.

10. The method of claim 1, wherein step (a) is conducted for 5-10 minutes at room temperature.

11. The method of claim 1, wherein step (a) additionally comprises ultrasonication.

12. The method of claim 1, wherein in steps (a) and (c) the boron-doped diamond film is an anode; and graphite is a cathode.

13. The method of claim 1, wherein in step (b) the solution is heated to 50-60° C.

14. The method of claim 1, wherein step (c) is conducted for 5-10 minutes at room temperature.

15. The method of claim 1, wherein step (d) is conducted for 5-10 minutes at 50-60° C.

16. The method of claim 1, wherein step (f) is conducted for 2-5 minutes at 50-60° C.

17. The method of claim 1, further comprising drying of the silicon surface in step (g).

18. The method of claim 1, wherein in steps (a) and (c) the current is passed through aqueous cleaning agent solution at a flow of 30 to 60 A by placing a potential between electrodes of about 15 V.

19. The method of claim 1, wherein said aqueous cleaning agent solution is an alkaline solution having an alkaline pH of above 7.

20. The method of claim 1, wherein said aqueous cleaning agent solution through which current is passed using a boron-doped diamond film as an electrode is an internally-ionized solution.

21. A method of removal surface contaminants from silicon wafer surface comprising the following steps in the order appearing below:
    (a) submerging the silicon wafer surface in an aqueous cleaning agent solution through which current is passed using a boron-doped diamond film as an electrode; then, removing the silicon wafer surface from the aqueous cleaning agent solution;

(b) submerging the silicon wafer surface in the aqueous cleaning agent solution;

subjecting the silicon wafer to ultrasound waves; and, optionally, heating the solution; then, removing the silicon wafer surface from the aqueous cleaning agent solution;

(c) submerging the silicon wafer surface in an electrolyte solution through which current is passed using a boron-doped diamond film as an electrode; then, removing the silicon wafer surface from the electrolyte solution;

(d) submerging the silicon wafer surface in water with ultrasound and heating; then, removing the silicon wafer surface from the water;

(e) repeating step (d); and (f) spraying the silicon surface with water;

wherein said aqueous cleaning agent solution comprises a cleaning agent and water at a volume ration ranging from 8 to 15 parts of water for every part of the cleaning agent;

said cleaning agent comprises from 2% to 15% of surfactants by volume, 40% to 45% of bases by volume, and water;

said surfactant is a non-ionic surfactant;

said non-ionic surfactant is a polyoxyethylene surfactant, a polyol esters surfactant, or a polymer surfactant;

said base is an amine or a hydroxyalkyl amine;

said aqueous cleaning agent solution through which current is passed using a boron-doped diamond film as an electrode is an internally-ionized solution; and said aqueous cleaning agent solution is an alkaline solution having an alkaline pH of above 7.

* * * * *